US007600720B2

(12) United States Patent  (10) Patent No.: US 7,600,720 B2
Vogel et al.  (45) Date of Patent: Oct. 13, 2009

(54) HORIZONTAL CABLE MANAGER

(75) Inventors: Mark A. Vogel, Hinsdale, IL (US); Walter J. Moehle, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 4 days.

(21) Appl. No.: 11/946,974

(22) Filed: Nov. 29, 2007

(65) Prior Publication Data

US 2008/0121423 A1 May 29, 2008

Related U.S. Application Data

(60) Provisional application No. 60/867,628, filed on Nov. 29, 2006.

(51) Int. Cl.
*F16L 3/00* (2006.01)
(52) U.S. Cl. .............................. 248/49; 248/56; 385/135
(58) Field of Classification Search ................. 385/135, 385/136; 242/171; 174/72 A, 73.1; 248/49, 248/56
See application file for complete search history.

(56) References Cited

U.S. PATENT DOCUMENTS

| | | |
|---|---|---|
| 4,792,203 A | 12/1988 | Nelson et al. |
| 4,824,196 A | 4/1989 | Bylander |
| 5,066,149 A | 11/1991 | Wheeler et al. |
| 5,100,221 A | 3/1992 | Carney et al. |
| 5,285,515 A | 2/1994 | Milanowski et al. |
| 5,402,515 A | 3/1995 | Vidacovich et al. |
| 5,659,655 A * | 8/1997 | Pilatos ........................ 385/136 |
| 5,740,299 A | 4/1998 | Llewellyn et al. |
| 5,778,131 A | 7/1998 | Llewellyn et al. |
| 5,894,540 A | 4/1999 | Drewing |
| 6,081,645 A | 6/2000 | Dotzer et al. |
| 6,263,141 B1 | 7/2001 | Smith |
| 6,278,830 B1 | 8/2001 | Levesque et al. |
| 6,282,360 B1 | 8/2001 | Milanowski et al. |
| 6,356,697 B1 | 3/2002 | Braga et al. |
| 6,571,047 B1 | 5/2003 | Yarkosky et al. |
| 6,603,918 B2 | 8/2003 | Daoud et al. |
| 6,711,338 B2 | 3/2004 | Lin et al. |
| 6,715,619 B2 | 4/2004 | Kim et al. |
| 6,748,155 B2 | 6/2004 | Kim et al. |
| 6,763,171 B2 | 7/2004 | D'Inca |
| 6,772,887 B2 | 8/2004 | Audibert et al. |
| 6,809,258 B1 * | 10/2004 | Dang et al. .................... 174/50 |
| 6,819,857 B2 | 11/2004 | Douglas et al. |
| 6,845,207 B2 | 1/2005 | Schray |

(Continued)

FOREIGN PATENT DOCUMENTS

GB 2241221 A 8/1991

*Primary Examiner*—Amy J. Sterling
(74) *Attorney, Agent, or Firm*—Robert A. McCann; Christopher S. Clancy

(57) ABSTRACT

A cable slack manager apparatus for use in a zone box comprises a base plate and two or more cable slack management members. The cable slack management members may be releasably secured to the base plate and may comprise at least two straight portions and a rounded portion positioned therebetween. The management members may be angled relative to a front edge of the base plate. A distance between slack management members and opposing sidewalls of the base plate may be progressively smaller for slack management members positioned closer to the front edge of the base plate. Various configurations are possible.

15 Claims, 6 Drawing Sheets

U.S. PATENT DOCUMENTS

| | | |
|---|---|---|
| 6,865,331 B2 | 3/2005 | Mertesdorf |
| 6,925,241 B2 | 8/2005 | Bohle et al. |
| 6,944,383 B1 | 9/2005 | Herzog et al. |
| 2003/0202765 A1* | 10/2003 | Franklin et al. ............ 385/135 |
| 2005/0100302 A1* | 5/2005 | Schray ....................... 385/135 |
| 2005/0276561 A1 | 12/2005 | Aziz et al. |
| 2007/0104447 A1* | 5/2007 | Allen ......................... 385/135 |

* cited by examiner

HORIZONTAL CABLE MANAGER

CROSS-REFERENCE TO RELATED APPLICATIONS

This application claims priority to U.S. Provisional Patent Application No. 60/867,628, filed Nov. 29, 2006, the subject matter of which is hereby incorporated herein by reference in its entirety.

FIELD OF THE INVENTION

This invention relates to cable managers and more particularly, to horizontal cable slack managers.

BACKGROUND

Buildings, in particular office buildings, include various enclosures for housing telecommunication equipment and associated connectors, such as patch panels and switches. Intricate pathworks of cables connect the electrical equipment and connectors. Cables connect electrical equipment located in a main equipment room to telecommunications equipment located in telecommunications rooms on different floors, for example. Cables associated with the telecommunications equipment also extend into additional enclosures positioned in strategically placed zones throughout the different floors to establish electrical connections, such as ethernet connections.

These enclosures, often called "zone boxes," house Ethernet connectivity, such as switches and patch panels, adapted to receive cabling extending from the telecommunications equipment, positioned in locations remote from the zone boxes. Cables, typically copper cables, within the zone box connect the various switches and patch panels. Additional cables may extend out of the zone box to specific work or coverage areas, to establish connections with a mix of local devices, such as personal computers, printers, workstations and certain video cameras.

Recent increases in bandwidth requirements for telecommunication and other systems have resulted in more densely packed equipment and an increased number of cables per piece of equipment than prior systems. Equipment, such as Power over Ethernet (PoE) switches in zone boxes, can overheat and become damaged when there is no organized route for the cables to follow that keeps them from interfering with air flow.

There is a need, therefore, for a horizontal cable slack manager that routes and stores cable slack in an organized way.

SUMMARY OF THE INVENTION

The present invention relates to an improved horizontal cable slack manager and methods for making and using the same.

A cable slack manager apparatus comprises a base plate comprising a front edge, two or more cable slack management members, each cable slack management member comprising at least two straight portions and a rounded portion positioned therebetween, with the cable slack management members positioned in spaced apart locations on the base plate and a plane defined by the at least two straight portions of each cable slack management member intersecting an axis positioned along the front edge of the base plate at an angle, wherein the angles formed by the plane and the axis are progressively larger for cable slack management members positioned closer to the front edge of the base plate.

A cable slack manager apparatus comprises a base plate comprising a front edge and opposing sides, a plurality of cable slack management members, each cable slack management member comprising a rounded portion with the cable slack management members positioned in spaced apart locations on the base plate, wherein cable slack management members positioned closer to the front edge are positioned closer to the opposing sides.

A cable slack manager apparatus comprises a base plate comprising a front edge, one or more cable slack management members, each comprising at least two straight portions with a rounded portion positioned therebetween and at least one corner where the straight portions and the rounded portion meet, wherein each of the cable slack management members is angled relative to the front edge, such that cable slack routed around the cable slack management members does not contact the at least one corner.

In an enclosure apparatus comprising vertical rails, at least one patch panel and at least one switch, an improvement comprises a cable slack manager apparatus comprising a base plate carrying a plurality of cable slack management members, the base plate mounted to the vertical rails between the at least one patch panel and the at least one switching with the base plate positioned transverse to the vertical rails.

BRIEF DESCRIPTION OF THE DRAWINGS

Certain embodiments of the present invention are illustrated by the accompanying figures. It should be understood that the figures are not necessarily to scale and that details not necessary for an understanding of the invention or that render other details difficult to perceive may be omitted. It should also be understood, of course, that the invention is not necessarily limited to the particular embodiments illustrated herein.

DETAILED DESCRIPTION

Figure 1:
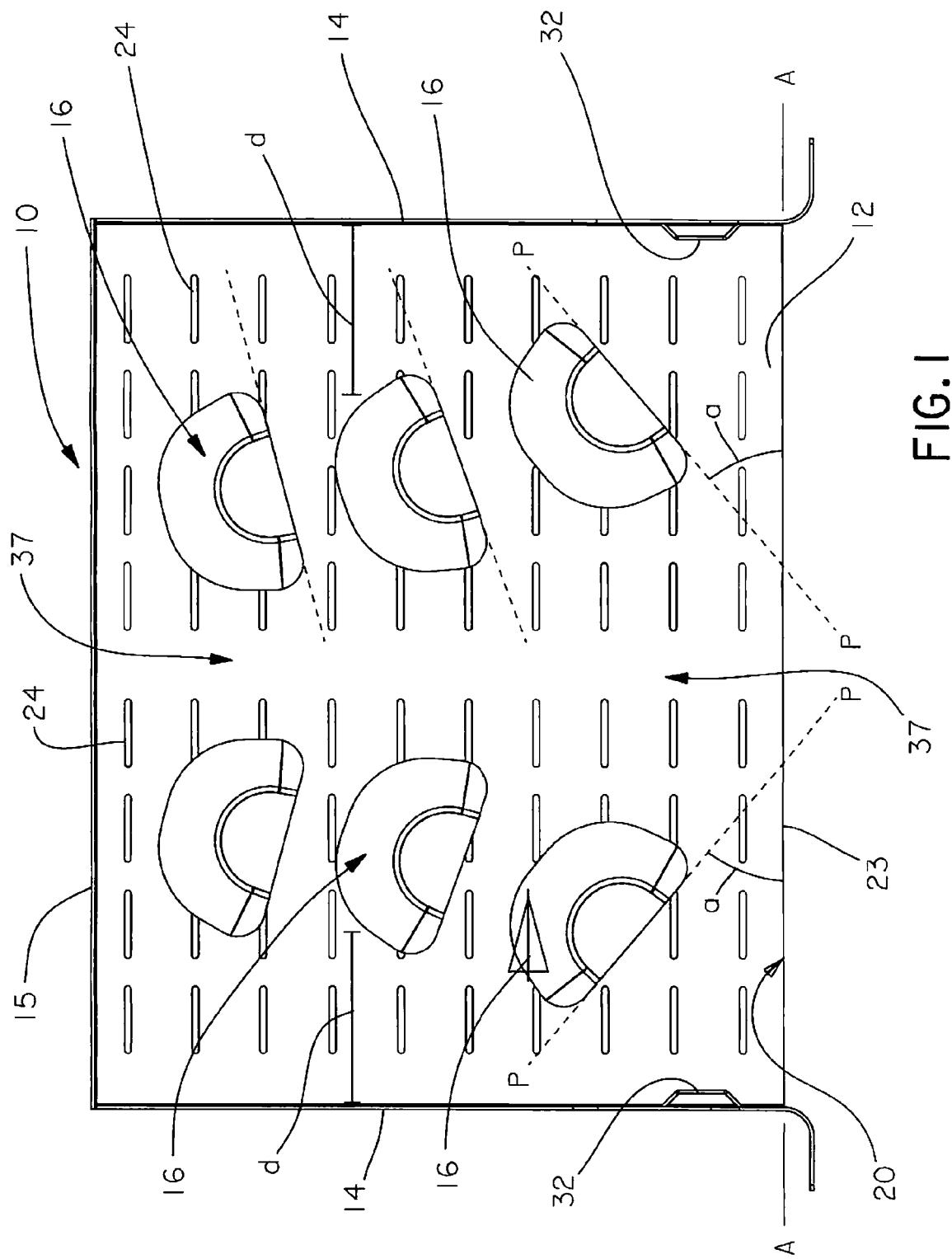
FIG. 1 is a top plan view of the cable manager apparatus of the present invention with cable slack management members secured to a base plate.

Referring now to FIGS. 1-6, one embodiment of the cable slack manager apparatus 10 of the present invention is shown. Manager 10 may comprise base plate 12, sidewalls 14, slack management members 16 and bend radius posts 18, the features of which are shown and described in a co-pending, co-owned application Ser. No. 60/867,646, filed Nov. 29, 2006, entitled "Bend Radius Post," the disclosure of which is hereby incorporated by reference in its entirety.

Base plate 12 comprises top and bottom portions 20 and 22 and front edge 23. Front edge 23 may be rounded to avoid damage to cables passing over base plate 12. Base plate 12 further defines slots 24 and dual mounting apertures 26. Slots 24 allow passage of air through base plate 12 for venting purposes. Mounting apertures 26 are adapted to receive and retain slack management members 16.

Figure 2:
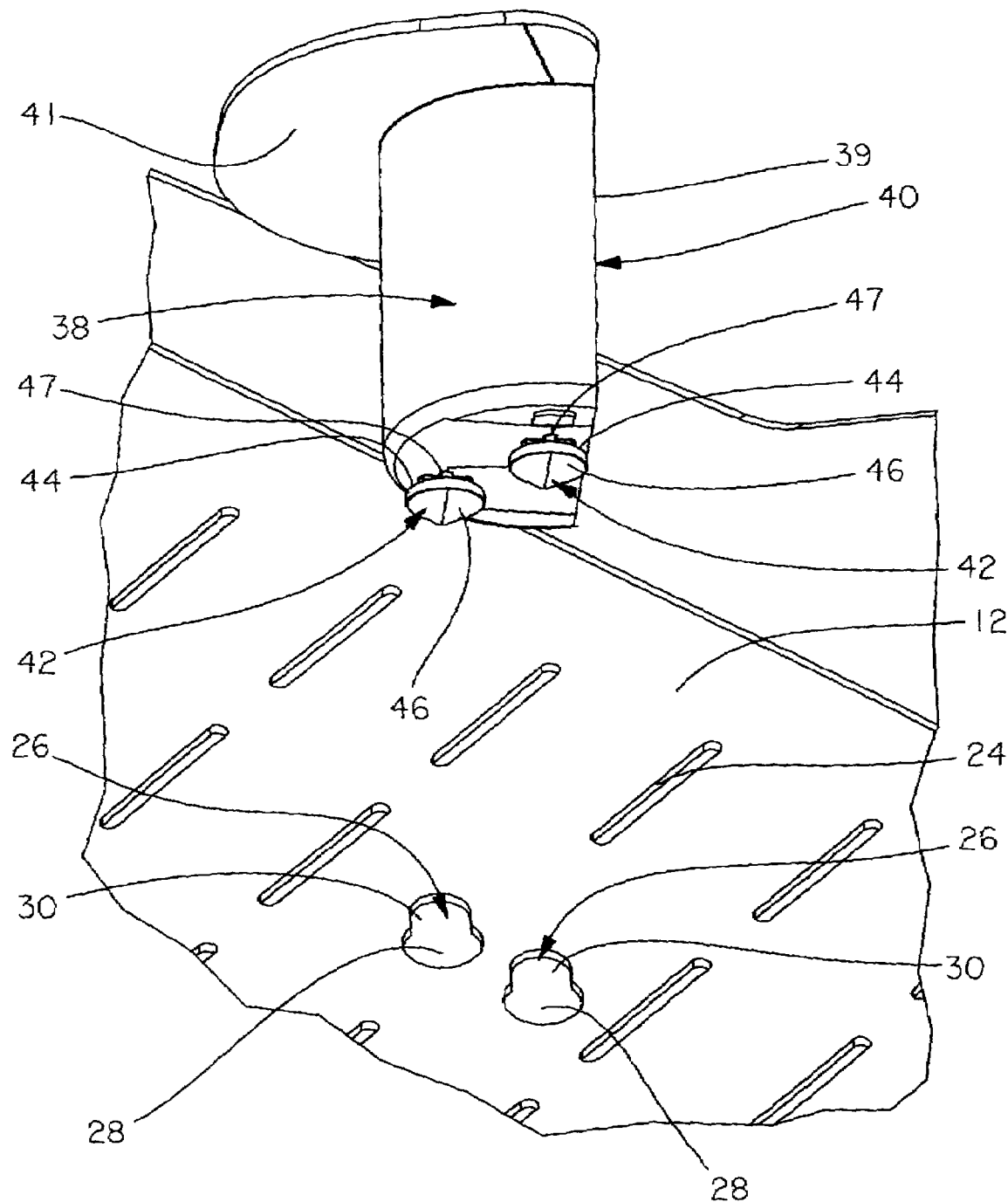
FIG. 2 is a perspective and partially cut away exploded view of one of the cable slack management members and the base plate of FIG. 1.

To more effectively manage cable slack, mounting apertures 26 may be positioned in spaced apart locations at predetermined angles. As discussed hereinafter, this positioning advantageously impacts the placement of slack management members 16. Individual pairs of mounting apertures 26 may be aligned with other pairs of mounting apertures 26. As shown in FIG. 2, mounting apertures 26 typically exhibit a keyhole shape comprising first end 28 with a larger width dimension than second end 30.

Sidewalls 14 and rear wall 15 may extend upwardly and transversely relative to base plate 12. Sidewalls 14 may comprise cable tie receiving member 32 and mounting flanges 34 for securing manager 10 to another structure. Cable tie receiving member 32 is adapted to receive a cable tie for securing bundles of cable slack that pass through manager 10. Mounting flanges 34 comprise apertures 36 that mate with apertures positioned within a rail of an enclosure, such as a zone box.

Slack management members 16 are typically C-shaped and comprise rounded portion 38, straight portions 39, corners 40 (where rounded portion 38 and straight portions 39 meet) and overhang 41. Rounded portion 38, positioned between straight portions 39, enables users to wind cable slack around slack management members 16 and provides bend radius control, helping to avoid exposure of cable slack to corners 40 that may undesirably shear or damage the cable. Overhang 41 is adapted to retain and prevent unwanted slippage of cable slack.

Figure 3:
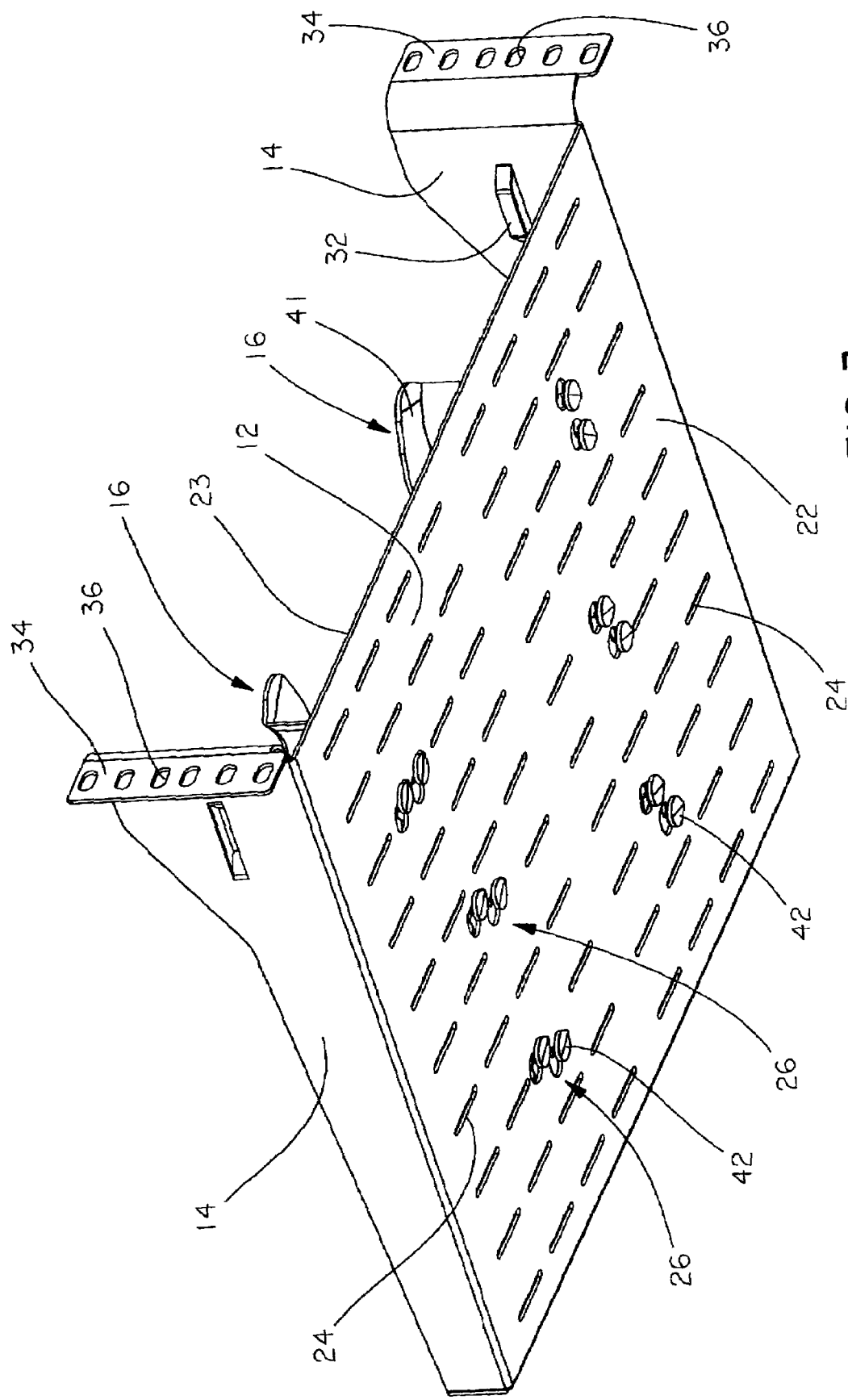
FIG. 3 is a bottom perspective view of FIG. 1.

The dimensions and number of slack management members 16 may vary. Slack management members 16 typically extend circumferentially about 180°. Although six slack management members 16 arranged in two vertical columns are shown in FIGS. 1-3, as few as two or more than six members 16 may be employed, depending on the depth of the enclosure and the vertical spacing between the patch panels and switch. For example, more than six slack management members 16 may be employed in a larger or full-size cabinet. Open space 37 is adapted to accommodate large bundles of cable slack, as individual cables accumulate around slack management members 16.

Slack management members 16 may be releasably secured to base plate 12 through boss 42 on undersides thereof. Boss 42 comprises top portion 44 and bottom portion 46 and is connected to slack management member 16 through post 47, such that boss 42 is spaced apart from a bottom surface of slack management member 16. Boss 42 generally exhibits a complementary geometric shape to and a smaller dimension than mounting aperture 26. FIGS. 2 and 3 illustrate the manner in which boss 42 is used to secure slack management members 16 to base plate 12. Boss 42 engages base plate 12 with an interference fit (i.e., base plate 12 is trapped between a bottom surface of slack management member 16 and top portion 44 of boss 42).

The placement of slack management members 16 on base plate 12 is variable. In one embodiment, a plane P defined by straight portions 39 of each cable slack management member 16 intersects an axis A positioned along front edge 23 of base plate 12 at angle α. Angle a may be between about 20° and about 60°. Angling slack management members 16 enables cable slack routed around slack management members 16 to substantially avoid contact with corners 40. In one embodiment, angles α formed by plane P and axis A are progressively larger for cable slack management members 16 positioned closer to front edge 23 of base plate 12. Additionally or alternatively, distance d between slack management members 16 and sidewalls 14 may be successively smaller for slack management members 16 positioned closer to front edge 23 of base plate 12.

Manager 10 may be formed as separate pieces and assembled. Base plate 12 may be stamped from metal, while slack management members 16 and bend radius posts 18 may be separately molded out of plastic.

Figure 4:
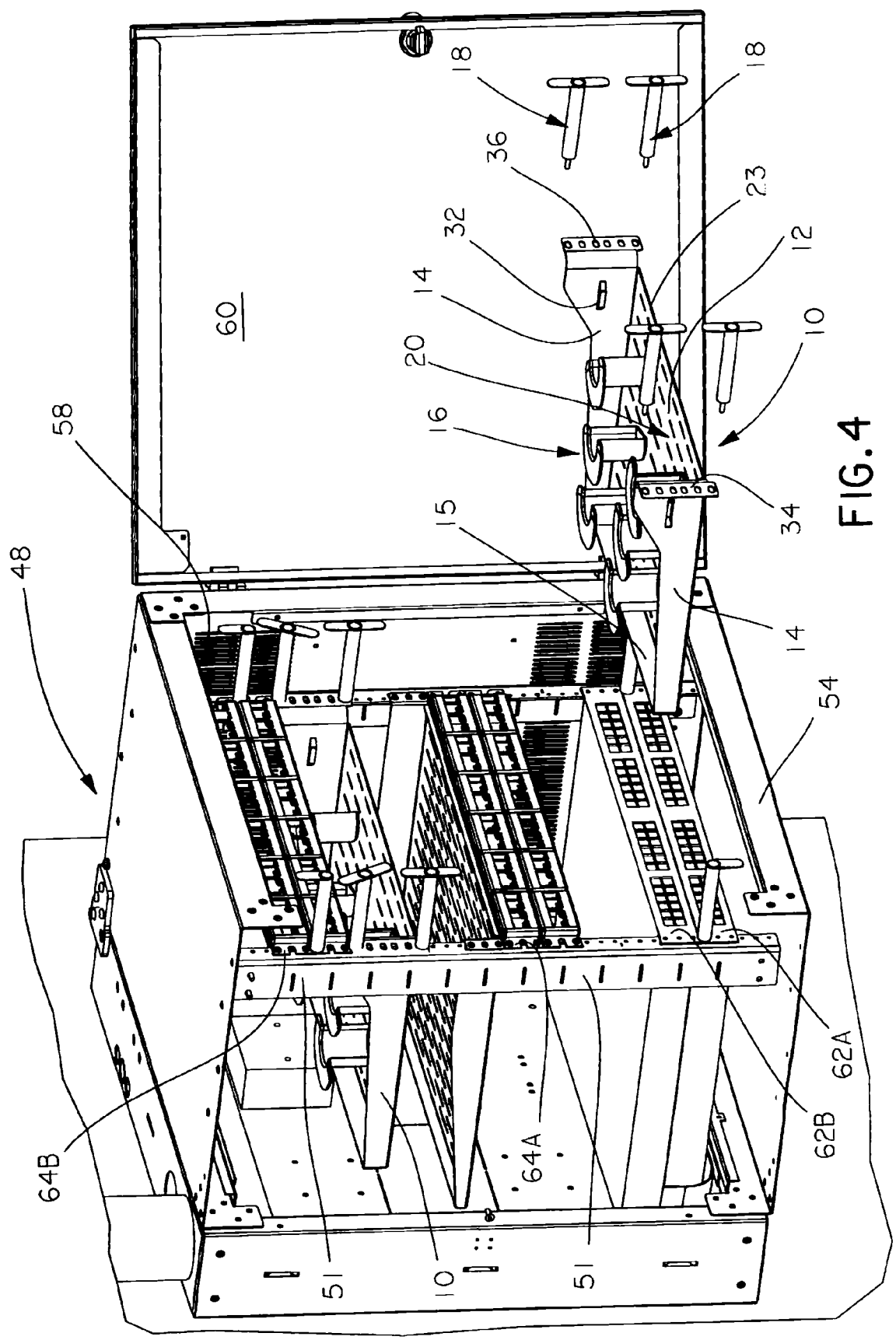
FIG. 4 is a partially exploded perspective view of a zone box and the cable manager apparatus of the present invention.
Figure 5:
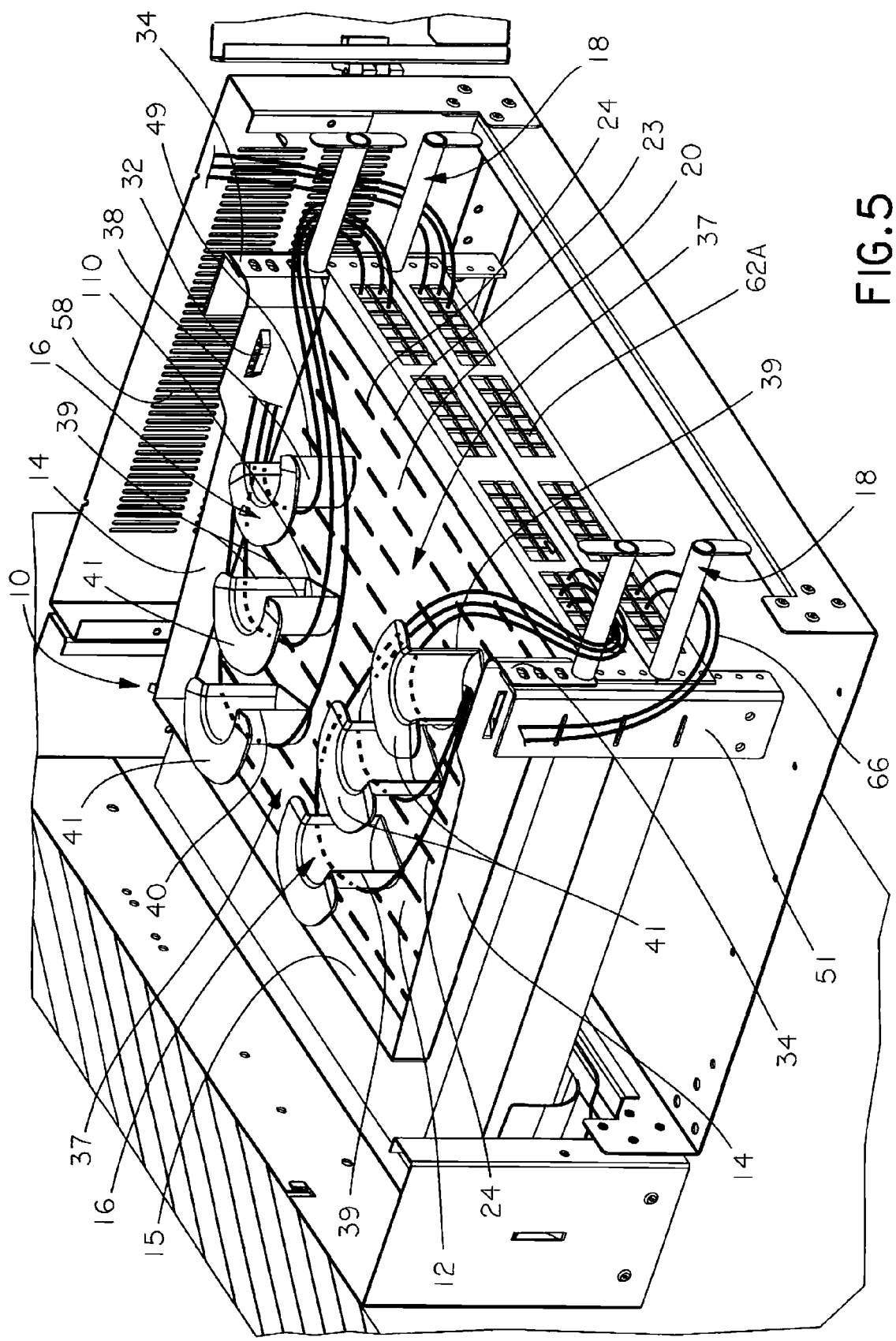
FIG. 5 is a partially cut away assembled view of FIG. 4.
Figure 6:
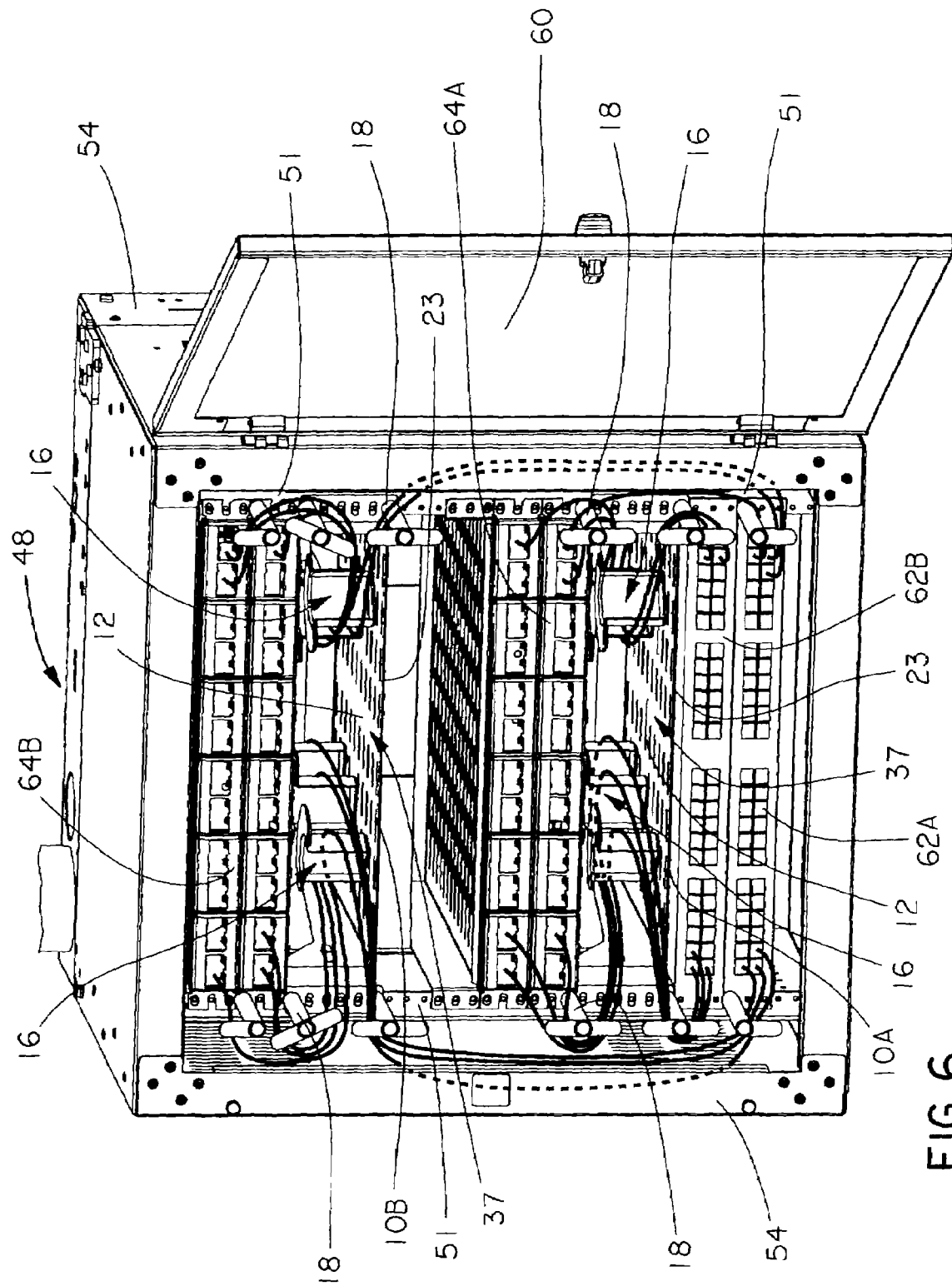
FIG. 6 is a perspective assembled view of FIG. 4.

Manager 10 may be utilized with various types of enclosures, particularly enclosures including vertical rails positioned within enclosure sidewalls. FIGS. 4-6, for example illustrate use of manager 10 in zone box 48. Zone box 48 comprises external frame 54, side vents 58 and hinged door 60. Vertical rails 51 carry various types of equipment, including switches 62A and 62B and patch panels 64A and 64B. Side vents 58 are adapted as air intakes to cool active ethernet equipment positioned within zone box 48. Door 60 may be hinged or screwed to zone box 48 so that users can readily access the aforementioned ethernet equipment.

With slack management members 16 in position on base plate 12, manager 10 may be secured to zone box 48 through screws (not shown). After installation, cables 66 may be routed around bend radius posts 18 and slack management members 16 to manage cable slack. Management of cable slack in this manner does not obstruct the open space adjacent to side vents 58 to help ensure proper thermal management. In one embodiment, substantially all cables 66 positioned within zone box 48 do not overlie side vents 58. In another embodiment, cable manager 10 renders zone box 48 compliant with American Society of Heating, Refrigeration and Air Conditioner Engineer "ASHRAE" standards for a "Class 1 Environment," maintaining a temperature at the inlet of switches 62A and 62B of less than about 90° F. and more particularly less than about 85° F. at an ambient temperature of about 72° F.

Cable slack length typically determines the manner in which cables 66 are routed. As best seen in FIG. 5, the longest cable slack contacts all three cable slack management members 16, and only routes around slack management member 16 positioned farthest from front edge 23, while the shortest cable slack only contacts and routes around the cable slack management member 16 positioned closest to front edge 23. This arrangement allows uniformly sized or standardized patch cords (e.g., 4 or 5 foot patch cord) to be utilized. Further, as described below and shown in FIG. 6, this arrangement advantageously nests groups of cable slack, without unwanted criss-crossing of cables 66. Cables 66 can thereby be readily and efficiently re-routed within zone box 48.

The positioning of manager 10 in zone box 48 depends upon user needs. As shown in FIG. 6, two switches 62A and 62B are successively stacked at the bottom of zone box 48, with first manager 10A and first patch panel 64A stacked directly above. Second manager 10B and second patch panel 64B overlie first patch panel 64A. Cables 66 emanating from first switch 62A may be routed through second manager 10B and connect to second patch panel 64B, while cables 66 emanating from second switch 62B may be routed through first manager 10A and first patch panel 64A.

The above-described structure and placement of manager 10 advantageously enables front-side access for moves, adds and changes to cable connections in zone box 48 by preventing crossover between their switches and associated patch panels. After opening hinged door 60 users can view cable connections and conveniently re-route cables 66 to the different ports of switches 62A and 62B and patch panels 64A and 64B.

While certain embodiments of the present invention have been shown and described, it will be obvious to those skilled in the art that changes and modifications may be made without departing from the spirit and scope of the invention. The matter set forth in the foregoing description and accompanying drawings is offered by way of illustration only and not as a limitation. The actual scope of the invention is intended to be defined in the following claims.

The invention claimed is:

1. A cable slack manager apparatus comprising:
a base plate comprising a front edge,
at least three cable slack management members, each cable slack management member comprising at least two straight portions and a rounded portion positioned therebetween, with said cable slack management members positioned in spaced apart locations on said base plate and a plane defined by said at least two straight portions of each cable slack management member intersecting an axis positioned along said front edge of said base plate at an angle, wherein said angles formed by said plane and said axis are progressively larger for cable slack management members positioned closer to said front edge of said base plate; and
wherein the cable slack management member positioned closest to said front edge of said base plate defines the largest of said angles and said slack management members each extend circumferentially about 180 degrees.

2. The cable slack manager apparatus of claim 1, wherein said base plate comprises opposing sidewalls extending upwardly relative to said base plate, said opposing sidewalls comprising one or more cable tie receiving members.

3. The cable slack manager apparatus of claim 2, wherein a distance between said slack management members and opposing sidewalls is progressively smaller for slack management members positioned closer to said front edge of said base plate.

4. The cable slack manager apparatus of claim 1, wherein said angle is between about 20 degrees and 60 degrees.

5. The cable slack manager apparatus of claim 1, wherein said cable slack management members are releasably securable to said base plate.

6. A cable slack manager apparatus comprising:
a base plate comprising a front edge and opposing sides;
a plurality of cable slack management members, each cable slack management member comprising a rounded portion, said cable slack management members positioned in spaced apart locations on said base plate, wherein cable slack management members positioned closer to said front edge are positioned closer to said opposing sides; and
wherein said slack manager members comprise at least two straight portions defining a plane that intersects an axis positioned along said front edge of said base plate at an angle, wherein said angles formed by said plane and said axis are progressively larger for cable slack management members positioned closer to said front edge of said base plate.

7. The cable slack manager apparatus of claim 6, wherein said opposing sidewalls comprise one or more cable tie receiving members.

8. The cable slack manager apparatus of claim 6, wherein a distance between said slack management members and opposing sidewalls is progressively smaller for slack management members positioned closer to said front edge of said base plate.

9. The cable slack manager apparatus of claim 6, wherein said slack management members extend circumferentially about 180 degrees.

10. The cable slack manager apparatus of claim 6, further comprising an overhang positioned above said rounded portion, said overhang adapted to retain and prevent unwanted slippage of cable slack.

11. A cable slack manager apparatus comprising:
a base plate comprising a front edge;
a plurality of cable slack management members, each comprising at least two straight portions with a rounded portion positioned therebetween and at least one corner where said straight portions and said rounded portion meet, wherein each of said cable slack management members is angled relative to said front edge, such that when cable slack is routed around said cable slack management members, said cable slack cannot contact said at least one corner; and
wherein said base plate comprises opposing sidewalls, and wherein a distance between said slack management members and opposing sidewalls is smaller for slack management members positioned closer to said front edge of said base plate.

12. The cable slack manager apparatus of claim 11, wherein said opposing sidewalls extend upwardly and comprise one or more cable tie receiving members.

13. The cable slack manager apparatus of claim 11, wherein said slack management members extend circumferentially about 180 degrees.

14. The cable slack manager apparatus of claim 11, further comprising an overhang positioned above said rounded portion, said overhang adapted to retain and prevent unwanted slippage of cable slack.

15. The cable slack manager apparatus of claim 11, wherein said straight portions define a plane intersecting an axis positioned along said front edge of said base plate at an angle, wherein said angles formed by said plane and said axis are progressively larger for cable slack management members positioned closer to said front edge of said base plate.

* * * * *